United States Patent [19]

Scovell et al.

[11] Patent Number: 4,965,216
[45] Date of Patent: Oct. 23, 1990

[54] METHOD OF FABRICATING A BI-CMOS DEVICE

[75] Inventors: Peter D. Scovell, Chelmsford; Peter F. Blomley, Bishop's Stortford; Roger L. Baker, Chelmsford, all of Great Britain

[73] Assignee: STC PLC, London, England

[21] Appl. No.: 471,031

[22] Filed: Jan. 26, 1990

Related U.S. Application Data

[63] Continuation of Ser. No. 412,539, Sep. 22, 1989, abandoned, which is a continuation of Ser. No. 249,203, Sep. 23, 1988, abandoned, which is a continuation of Ser. No. 27,870, Mar. 19, 1987, abandoned.

[30] Foreign Application Priority Data

Mar. 26, 1986 [GB] United Kingdom ................. 8607594

[51] Int. Cl.$^5$ ................. H01L 21/331; H01L 21/335
[52] U.S. Cl. ........................... 437/31; 437/34; 437/56; 437/162; 437/32; 148/DIG. 123; 148/DIG. 124
[58] Field of Search ............. 437/31, 32, 33, 34, 437/56, 57, 58, 162; 148/DIG. 123, DIG. 124; 357/34, 35, 43

[56] References Cited

U.S. PATENT DOCUMENTS

| | | | |
|---|---|---|---|
| 3,817,794 | 6/1974 | Beadle et al. | 437/31 |
| 3,951,693 | 4/1976 | Fisher et al. | 437/31 |
| 4,188,707 | 2/1980 | Asano et al. | 437/162 |
| 4,398,962 | 8/1983 | Kanazawa | 437/31 |
| 4,484,388 | 11/1984 | Iwasaki | 437/31 |

FOREIGN PATENT DOCUMENTS

| | | |
|---|---|---|
| 0097379 | 4/1984 | European Pat. Off. |
| 2171844 | 9/1986 | United Kingdom . |
| 2173638 | 10/1986 | United Kingdom . |

OTHER PUBLICATIONS

Cuthberson, A. et al., *IEEE IEDM Tech. Digest*, 1984, pp. 749-752.
Colclaser, *Microelectronics: Processing and Device Design*, John Wiley & Sons, 1980, pp. 212-217.

*Primary Examiner*—Brian E. Hearn
*Assistant Examiner*—T. N. Quach
*Attorney, Agent, or Firm*—Lee, Mann, Smith, McWilliams & Sweeney

[57] ABSTRACT

A process for fabricating a CMOS compatible bipolar transistor is described. The transistor, which is of the polysilicon emitter type, is fabricated by forming a p-type layer in a well, providing a polysilicon emitter in contact with the layer, using the emitter as a mask to implant p$^+$-type base contact regions, and applying contacts to the device.

2 Claims, 4 Drawing Sheets

METHOD OF FABRICATING A BI-CMOS DEVICE

This application is a continuation of U.S. patent application Ser. No. 412,539, filed Sept. 22, 1989, now abandoned, which in turn is a continuation of U.S. patent application Ser. No. 249,203, filed Sept. 23, 1988, now abandoned which is a continuation of U.S. patent application Ser. No. 27,870, filed Mar. 19, 1987, now abandoned.

This invention relates to semiconductor devices and in particular to bipolar transistors and to integrated circuits including both bipolar and field effect, in particular CMOS (Complementary Metal Oxide Silicon), transistors.

BACKGROUND OF THE INVENTION

Field effect circuits are used mainly in digital applications, whereas for analogue applications, such as in radio signal processing, bipolar circuits are more suitable. There is a need in certain applications, e.g. telephony, for the processing of both digital and analogue signals and this generally requires the provision of two circuit chips each with its associated peripheral circuitry. Many attempts have been made to combine bipolar and MOS technologies on the same chip but to date none has been entirely successful. A commonly used approach is to add a CMOS capability to a SBC (Standard Buried Collector) bipolar technology. This results in a device with high bipolar performance but poor CMOS capability. If bipolar devices are added to good CMOS technology the resulting triply diffused structures have high parasitic resistances and hence poor bipolar performance.

The object of this invention is to minimise or to overcome this disadvantage.

"Our co-pending U.S. patent application Ser. No. 133,269, filed Dec. 16, 1987, which is a continuation of U.S. patent application Ser. No. 83,685, filed Mar. 6, 1986 (corresponding to United Kingdom application No. 8603322) relates" construction that is compatible with CMOS processing and to a process for fabricating the bipolar transistor. Whilst that process is adequate for providing good devices we have now round that yield may be increased by the use of an alternative process.

SUMMARY OF THE INVENTION

According to one aspect of the invention there is provided a method of fabricating a bipolar transistor, the method including providing a semiconductor substrate having a doped n-type (p-type) well, forming a p-type (n-type) layer in the well, providing an emitter in contact with the layer, forming p+-type (n+-type) base contact regions extending through the layer, said emitter providing a mask whereby the base contact regions are aligned therewith, providing a collector contact region, and applying contacts to the collector contact region and to the base and emitter.

According to another aspect of the invention there is provided a method of fabricating simultaneously a bipolar transistor and a complementary pair of field effect (MOS) transistors disposed each in a respective well in a common substrate, the method including forming field oxide to define the device regions, masking the substrate, forming a window in the mask to expose substantially the whole of the bipolar device region, implanting a dopant through the window to define a layer in the bipolar region, selectively depositing polycrystalline silicon to define the emitter of the bipolar transistor and the gates of the MOS transistors, implanting source and drain regions of one said MOS transistor and base contact regions of the bipolar transistor using the polysilicon areas as an implantation mask, implanting a collector contact for the bipolar transistor and source and drain regions of the other said MOS transistors, providing an insulating layer over the assembly, and providing electrical contacts to the transistors.

By using the emitter as a mask whereby the contact regions are aligned, a previously required marking step is eliminated. Thus, the number of process steps previously required is reduced and the yield is correspondingly increased.

BRIEF DESCRIPTION OF THE DRAWINGS

An embodiment of the invention will now be described with reference to FIGS. 1 to 6 of the accompanying drawings in which.

DESCRIPTION OF THE PREFERRED EMBODIMENT

Figure 1:
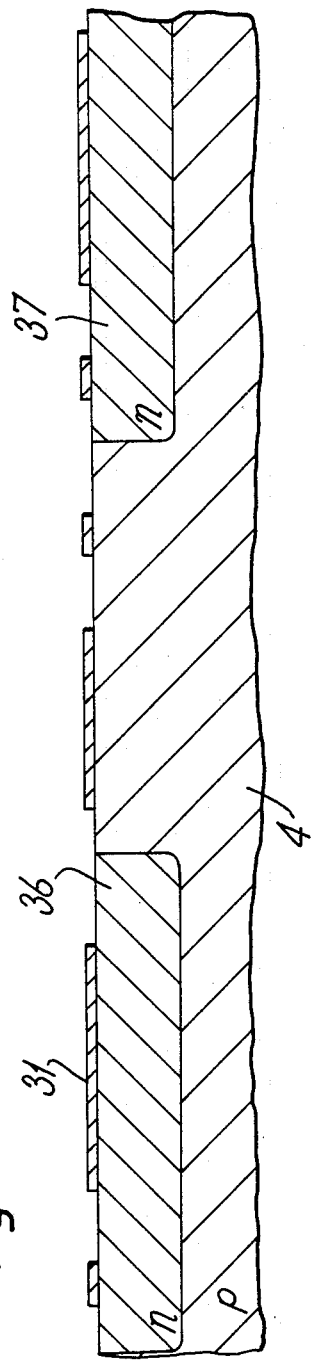
FIGS. 1 to 6 illustrate the sequence of steps in the fabrication of a bipolar, polysilicon emitter, transistor. By way of example FIGS. 1 to 6 also illustrate the formation of a complementary pair of CMOS transistors in the construction of a merged bipolar/CMOS integrated circuit.
Figure 2:
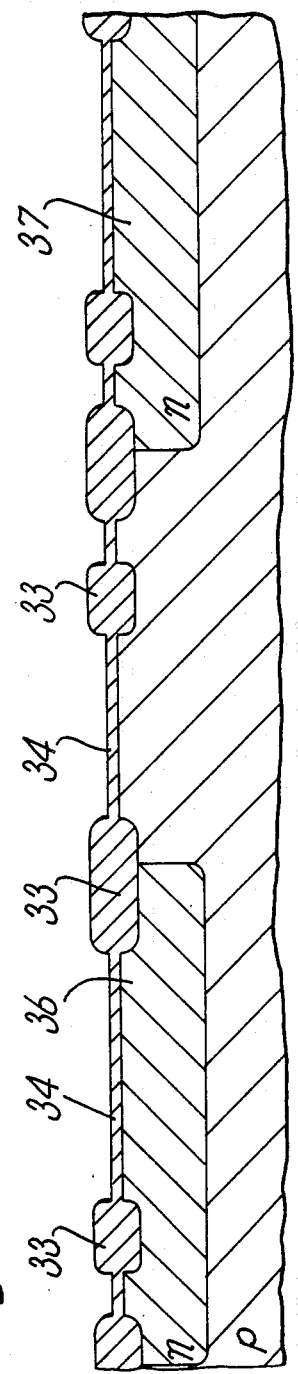
Figure 3:
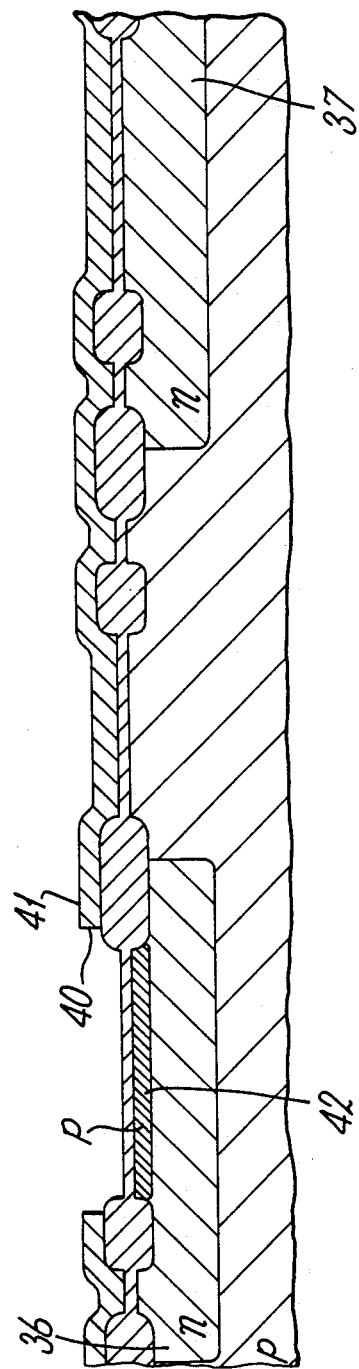
Figure 4:
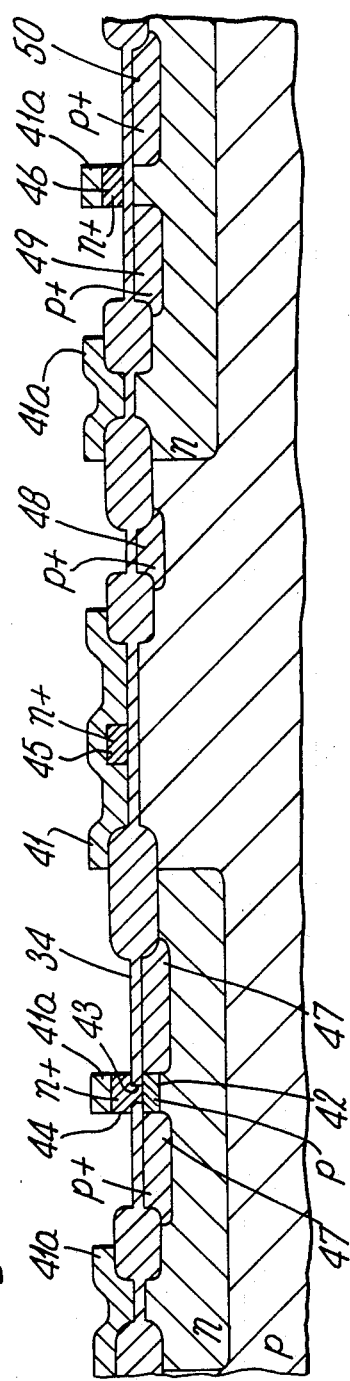

Referring to the drawings, by means of a first mask and photoresist (not shown) n-type wells 36 and 37 (FIG. 1) are defined in a p-type substrate 4, for example by ion implantation of phosphorus and subsequent driving-in in a conventional manner. Using a second mask (not shown) a layer of silicon nitride 31, or silicon nitride on silicon dioxide, deposited on the surface of the p-type silicon substrate 4 is patterned to distinguish between device areas and areas in which field oxide is to be grown. Areas of nitride 31 are left on the surface of the substrate 4 at positions corresponding to the device areas, as indicated in FIG. 1. Field dopant (not shown) may be implanted into the surface of substrate 4 by use of suitable masking through the windows opened in the nitride layer 31, by for example ion implantation of boron and/or phosphorus. The substrate is then oxidised in order to form field oxide 33 (FIG. 2) in the windows. The areas of nitride 31 are etched away and the substrate further oxidised in order to obtain thin oxide areas 34 between the thick field oxide areas 33. A third mask (not shown) is employed to define a window 40 in a photoresist layer 41 (FIG. 3), through which window p-type dopant, for example boron, is ion implanted to produce a p-type layer 42 the central portion of which will subsequently provide a base region for the bipolar transistor. The layer 42 is deposited over a relatively wide area and alignment is not critical at this stage. Using a fourth mask (not shown) and an appropriate photoresist layer a window 43 is opened in the thin oxide area covering the p-type layer 42. The alignment is not critical as will be apparent from the following. If an interfacial oxide is required for the polysilicon transistor a suitable treatment can be used now. The photoresist is removed and a layer of undoped polycrystalline silicon deposited and ion implanted with As or P. It is then patterned to produce a polycrystalline emitter 44 and gates 45 and 46 (FIG. 4). Then with the polysilicon 44 and 45 together with certain areas of the thin oxide area protected by appropriate patterned photoresist 41a, p+ dopant, for example boron, is implanted to provide base contact regions 47 for the bipolar device, the substrate contact 48 for the n-channel MOS transistor and the source and drain regions 49 and 50 for the p-channel MOS transistor. As an alternative to a photoresist mask at this stage an oxide mask may be employed. In this technique the exposed silicon is oxidised to grown an oxide layer which layer is thicker on the polysilicon (typically 1000 to 1400 A) than on the adjacent source and drain areas. The mask is then a standard S/D mask which does not involve critical alignment.

Figure 5:
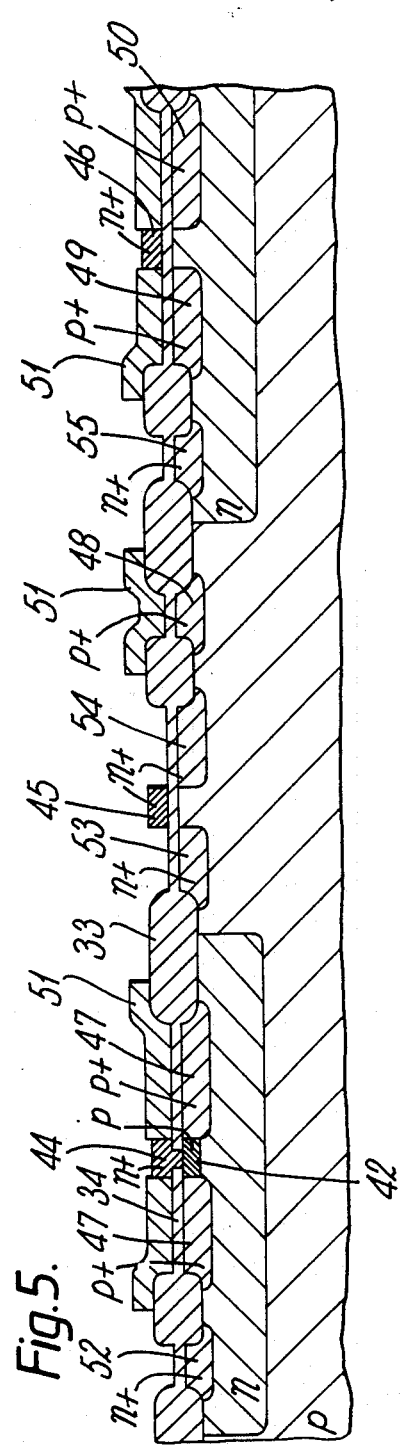

Using a further mask a layer of photoresist 51 is appropriately patterned to define windows whereby an n+ dopant, for example arsenic, is ion implanted to provide collector contact 52 for the bipolar device, source and drain regions 53 and 54 for the n-channel MOS transistor and the well contact 55 for the p-channel MOS transistor (FIG. 5). The photoresist 51 is removed and the wafer is oxidised and a layer or doped glass, e.g. P.S.G. (phosphosilicate glass) or BPSG (borophosphosilicate glass) deposited to produce an "oxide" layer. During the oxidation step, the associated thermal processing provides drive-in of the implants. Also, during this stage, out diffusion from the emitter into the base region 42 occurs to form a p⁻-type region 50 (FIGS. 6 and 7).

Figure 6:
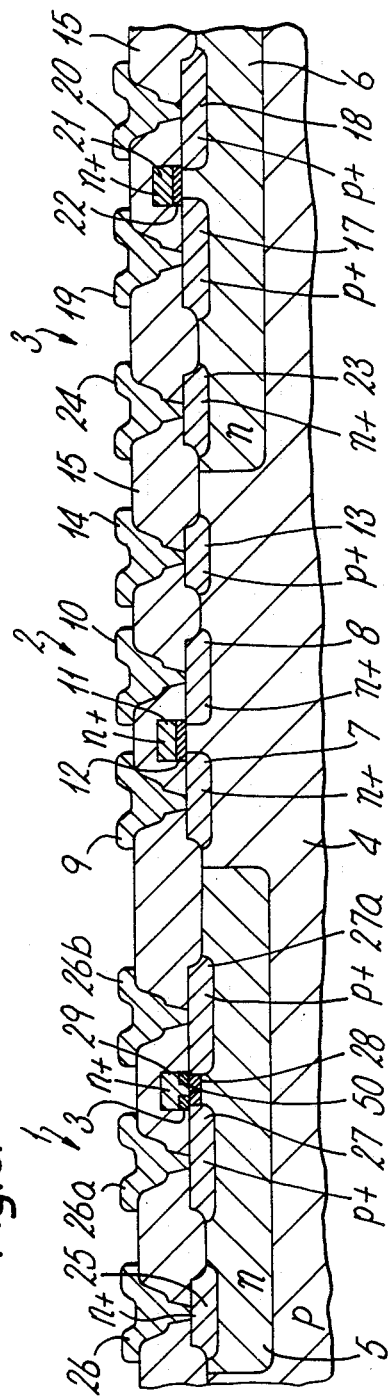
Figure 7:
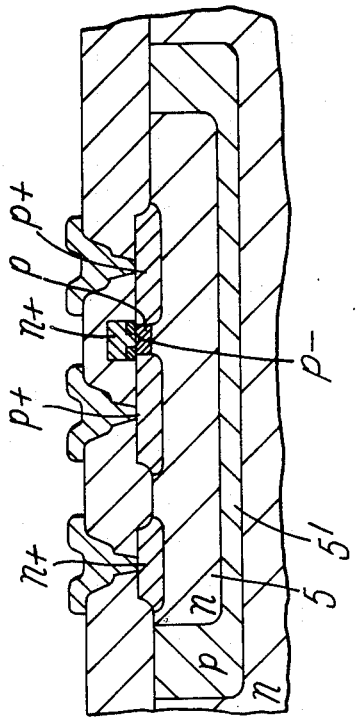

Using another mask windows are opened in the oxide for the provision of the requisite electrical contacts to the underlying regions, the thus processed substrate is then, for example, metallised and the metal patterned as appropriate using yet another mask to produce a structure equivalent to FIG. 6. Further masking and processing may be employed as is conventional for threshold tailoring of the n-channel and p-channel MOS transistors.

In the bipolar/CMOS structure illustrated in FIG. 6, the bipolar transistor is indicated at 1 and the n-channel and p-channel CMOS transistors at 2 and 3 respectively. The n-channel transistor 2 is formed directly in the substrate 4 whereas the bipolar transistor 1 and the p-channel transistor 3 are disposed in n-wells 5 and 6 respectively. The n-channel transistor 2 includes n+ source and drain regions 7 and 8, external metal contacts 9 and 10 to the source and drain, the polysilicon gate 11 together with gate oxide 12, a p+ contact 13 to the substrate 4 and a corresponding metal contact 14, and isolating oxide 15. The p-channel transistor 3 includes p+ source and drain regions 17 and 18 with corresponding metal contacts 19 and 20, the polysilicon gate 21 together with gate oxide 22, an n+ contact 23 to the n-well 6 and a corresponding metal contact 24, and isolating oxide 15. The bipolar transistor 1 employs the n-well 5 as its collector and has an n+ collector contact 25 thereto with an external metal contact 26. The base of this transistor comprises the two p+ contact regions 27 and 27a joined by a p bridging region 28 with two external metal contacts 26a and 26b. The emitter comprises the n+ polysilicon body 29 which contacts the p-region 28 either directly or via a very thin oxide film (not shown). An external electrical contact (not shown) is provided to the polysilicon emitter.

By using the high efficiency polysilicon emitter structure the doping levels of the base and collector regions of the bipolar transistor can be optimised to produce low base and collector series resistance whilst still achieving a high current gain. This latitude is not available in conventional, e.g. triply diffused bipolar transistors.

Whilst the source and drain regions of the CMOS transistors are produced in a fully aligned manner by virtue of the polysilicon gates, the emitter of the bipolar device is only semi self-aligned with the base comprised by regions 42 and 47, although the performance is not affected thereby.

Bipolar transistors with the structure illustrated in FIG. 6 and requiring only two additional masks to a conventional CMOS process have been manufactured and found to have very high performance. Thus this approach to the integration of bipolar and CMOS technologies provided devices capable of high performance analogue and digital functioning, the bipolar and CMOS transistors being formed simultaneously on the same chip.

The technique can be extended for use in a p-well CMOS technology by the addition of a bipolar 'n-well' mask, implant and diffusion part of the way through the CMOS p-well drive in. The rest of the process sequence is essentially similar to that described. An example of the bipolar element so formed is shown in FIG. 7.

Whereas polycrystalline silicon is employed in the specific embodiments described above both for the MOS transistor gate and for the bipolar transistor emitter, this is not the only possible material. Other materials may be used to form both the MOS transistor gate and the bipolar transistor emitter provided they have suitable properties. The material may be a conductive material incorporating a source of carriers and a dopant for forming the emitter. Examples of materials which may be used instead of polycrystalline silicon are oxygen doped polysilicon, refractory metals or refractory metal silicides, amorphous silicon (hydrogenated or otherwise).

The doped polycrystalline silicon may be manufactured by a process as described in our co-pending "[GB] U.S. patent application Ser. No. 107,891, filed Oct. 13, 1987, now abandoned (corresponding to United Kingdom application No. 8504725 [P. D. Scovell-R. L. Baker 11-5]).

We claim:

1. A method of fabricating simultaneously a polysilicon emitter bipolar transistor and a complementary pair of an n-channel and a p-channel field effect transistors in a common silicon semiconductor substrate, said bipolar transistor and n-channel field effect transistor being disposed in respective n-type wells in said substrate and said p-channel transistor being disposed in a substrate region located immediately between said n-type wells, the method consisting of the steps of;

(a) providing a uniform single crystal silicon substrate of p-type material;

(b) forming first and second spaced wells on n-type material in a major surface of the substrate by means of a first mask;

(c) providing a silicon nitride film on said surface and patterning said film by means of a second mask to define device areas in register with said n-type wells for the bipolar and n-channel field effect transistor and over an undoped substrate region between said wells for the p-channel field effect transistor;

(d) oxidising the substrate surface to form field oxide in those areas not protected by the nitride film;

(e) removing the nitride film from said protected areas and providing a thin oxide film in those areas;

(f) ion implanting a p-type layer beneath a said thin oxide film into said first n-type well by means of a third mask whereby to provide a base region for the bipolar transistor;

(g) providing by means of a fourth mask a window in that thin oxide film below which the p-type layer is implanted;

(h) depositing a layer of polycrystalline silicon (polysilicon) on said oxidised major surface and patterning said polysilicon layer by means of a fifth mask to define simultaneously a polysilicon emitter body in register with the window over the p-type layer in said first well, a first gate electrode over the second n-type well, and a second gate electrode over the substrate region between the well, said gate electrode being disposed each on or over the thin oxide;

(i) ion implanting a p-type dopant to provide $p^+$-type base contact regions contiguous with the p-type layer in said first well to form the base structure of the bipolar transistor, $p^+$-type drain and source regions for the n-channel transistor in said second n-type well and a $p^+$-type substrate contact region between the wells, the polysilicon emitter body and the first polysilicon gate providing alignment masks for the p-type base contact and source and drain regions respectively, and a sixth mask providing, in combination with the patterned field oxide, for the positioning of the $p^+$-type substrate contact;

(j) ion implanting by means of a seventh mask an $n^+$-type dopant to provide an $n^+$-type collector contact region in said first well and spaced from the base structure, $n^+$-type drain and source regions for the p-channel transistor in the substrate region between the wells, and an $n^+$-type well contact in said seventh well;

(k) oxidising the substrate surface, applying a glass layer thereto, and patterning said glass layer by means of an eighth mask to provide contact windows in the glass layer exposing the $p^+$-type base contact regions and the collector contact region of the bipolar transistor, the drain and source regions of the p-channel and n-channel transistors, and the well contact, the oxidising step providing thermal drive-in of the ion implants;

(l) metallizing the substrate surface and patterning the metallization by means of a ninth mask to contact the exposed regions via said contact windows.

2. A method as claimed in claim 1, wherein an insulator is provided between said polysilicon emitter body and the substrate, the insulation being sufficiently thin to permit tunnelling of electrons therethrough.

* * * * *